United States Patent [19]

Asazawa

[11] Patent Number: 5,352,992
[45] Date of Patent: Oct. 4, 1994

[54] AMPLIFIER CIRCUIT

[75] Inventor: Hiroshi Asazawa, Tokyo, Japan

[73] Assignee: NEC Corporation, Tokyo, Japan

[21] Appl. No.: 59,061

[22] Filed: May 7, 1993

[30] Foreign Application Priority Data

May 7, 1992 [JP] Japan .................................. 4-114394

[51] Int. Cl.$^5$ .......................... H03G 11/00; H03G 5/00
[52] U.S. Cl. .................................... 330/310; 330/291;
330/293; 330/296; 330/311
[58] Field of Search ................ 330/291, 293, 296, 310, 330/311

[56] References Cited

U.S. PATENT DOCUMENTS 4,553,108  11/1985  Young ................................. 330/293
5,180,989  1/1993  Sakurai et al. ....................... 330/311

OTHER PUBLICATIONS

"A wide-Band Class AB Monolithic Power Amplifier" Robert G. Meyer et al., IEEE Journal of Solid State Circuits, Feb. 1989.

"UHF-Band Bipolar Downconverter IC for TV Tuner", Nakata et al., NEC, vol. 41, No. 14/1988.

"High Speed, Low Power Circuit: SPL", Tanabe, et al., Hitachi Central Reasearch Lab.

*Primary Examiner*—William L. Sikes
*Assistant Examiner*—Fetsum Abraham

[57] ABSTRACT

An amplifier circuit having an emitter-grounded amplifying stage formed of a transistor Q1 and a load resistor $R_L$ and having an output stage including an emitter follower formed of transistors Q2 and Q3. The base of the transistor Q1 of the amplifying stage and the base of the transistor Q3 of the output stage are connected with each other for receiving input signals and biased by a bias circuitry 5. The input signals thus given to the base of transistor Q3 for the emitter follower of the output stage cause the transistors Q2 and Q3 to alternately turn on and off to provide a higher output driving power to the load connected to the output terminal than prior art amplifier circuits having conventional emitter followers and resistor feedback amplification networks.

5 Claims, 5 Drawing Sheets

AMPLIFIER CIRCUIT

FIELD OF THE INVENTION

This invention relates to an amplifier circuit, and more particularly, to an amplifier circuit for amplifying high frequency analogue signals in and above UHF bands.

BACKGROUND OF THE INVENTION

A typical high frequency amplifier circuit operable in the frequency bands mentioned above has a circuit configuration comprising a bipolar semiconductor (hereinafter referred to as semiconductor) with its emitter grounded, its base connected with a signal line, and its collector connected with a load or impedance for generating an output signal.

In order no enhance its output power (i.e. electric power be supplied to the impedance connected to the output terminal of the amplifier circuit), a low-impedance emitter follower is often provided in the output stage of the circuit, yielding its output from the output terminal of the emitter follower, as shown in FIG. 1.

Such an amplifier circuit as illustrated in FIG. 1 includes an emitter-grounded amplifying stage comprising an NPN transistor Q1 whose emitter and base are connected with a grounded terminal 1 and a bias resistor RB, respectively, and a load resistor $R_L$ connected between the collector of the transistor Q1 and a high-voltage power source 2. An emitter follower of the output stage includes another NPN transistor Q2 having a collector connected with the high-voltage power source 2 and a base connected with the collector of the transistor Q1 of the amplifying stage, and a resistor $R_C$ connected between the emitter of the transistor Q2 and the grounded terminal 1. In this amplifier circuit a signal input to the input terminal 3 is amplified by the amplifying stage formed of the transistor Q1 and the load resistor $R_L$, and amplified signal is output from the output terminal 4 via the emitter follower of the output stage formed of the transistor Q2 and a resistor $R_C$.

Since such amplifier circuit has a low output impedance associated with the emitter follower serving as an output stage, the output driving power is improved greatly, thereby saving power consumption in the circuit.

Recently, there exists a further need of improvement in amplifier circuits for use with battery operated electronic circuits, such as portable wireless telephone systems, operable in high frequency bands. It is then necessary to further reduce power consumption in such electronic circuits.

However, such an amplifier circuit as shown in FIG. 1 has a disadvantage that, if its operational current is lowered to reduce energy consumption, output drive power available for a load is diminished and the output signal is distorted, though its output impedance is lowered by the emitter followers.

There have been known amplifier circuits, as shown in FIGS. 2 and 3, which may provide a fairly large output driving power while suppressing the energy consumption.

FIG. 2 is a circuit reported in NEC Technical Report, vol. 41, No. 14, PP. 260–263 (1988), which has a higher output driving power than the foregoing amplifier circuit. (It should be understood that components which are not relevant to basic amplifying operations are not shown in FIG. 2 for brevity.) This amplifier circuit has a resistor R1 connected between the emitter of a transistor Q1 in an amplifying stage and a grounded terminal 1, thereby forming an emitter follower. The signal retrieved from the emitter follower is then applied to the base of a transistor Q3 serving as a constant current source, so that a large output driving power may be obtained. Connected between the base of the transistor Q1 and an output terminal 4 is a resistor $R_B$ for providing a base bias voltage under self-biasing scheme. Also, connected between the emitter of the transistor Q3 and the grounded terminal 1 is a resistor R2 for determining the current through the transistor Q3.

In this amplifier circuit signals input to a terminal 3 is retrieved from the output terminal 4 through the transistors Q1 and Q2 on one hand, and, on the other hand, through the emitter follower formed of the transistor Q1 and the resistor R1 and via the transistor Q3. In order for the transistor Q1 to act as an emitter follower, it is necessary that the resistor R1 is fairly great. However, if R1 is great, high frequency characteristics of the amplifying stage consisting of the transistor Q1 and a load resistor $R_L$ are undesirably deteriorated in its fidelity in comparison to the emitter-grounded amplifier circuit shown in FIG. 1. In fact, as described in the above literature, the circuit shown in FIG. 2 is designed as an IF amplifier circuit for use in an output stage of a down converter for 100 MHz or below, with its nominal operational frequency at 1 GHz or below, so that it would not be suitable for amplification in frequency bands above 1 GHz.

The second example shown in FIG. 3 has a portion functioning as an emitter follower as of transistor Q1 of FIG. 2 and another portion functioning as a signal transfer circuitry, as of the transistor Q1 of FIG. 2, for transferring signals to a transistor Q3. Separation of the two functions results in improved high frequency characteristics when compared to the amplifier circuit shown in FIG. 2. (For brevity of representation elements irrelevant to basic amplifying operations are also abbreviated in FIG. 3.) This circuit is discussed in IEEE Journal of Solid-State Circuits, Vol. 24, No. 1, 7–12 (February, 1989). In this amplifier circuit, the base of the transistor Q1 is self-biased by means of a bias circuitry formed of a resistor $R_B$ connected with the base of the transistor Q1 in a amplification stage and of a diode D connected with a constant current power source C and the emitter of the transistor Q1. The diode D is included in this manner so that the output of an emitter follower consisting of a transistor Q4 and a resistor R3 may be coupled directly to the base of a transistor Q3. The transistors Q2 and Q3 constitute an output emitter follower of the output stage of the circuit. Thus, the transistor Q3 is provided on its base with the signal having the same phase as the input signal.

Since the amplifier circuit shown in FIG. 3 has an amplifying stage (consisting of the transistor Q1 and a load resistor $R_L$) separated from the emitter follower (consisting of the transistor Q4 and the resistor R3) for applying signals to the base of the transistor Q3 serving for driving the emitter follower of the output stage, the circuit has better high frequency characteristics than the one shown in FIG. 2. However, the high frequency characteristics of the circuit are inferior to those of the emitter-grounded circuit shown in FIG. 1. This is due to the fact that the diode D is connected between the emitter of the transistor Q1 of the amplifying stage and the grounded terminal 1 for equalizing the potential levels of the emitter and the terminal 1. Further, although the resistor $R_B$ provides self-biassing to the transistor Q1 in controlling the current through it, it is the resistor R2 that provide feedback to the transistor Q3 to control the current through the transistor Q3. Thus, as the current $I_{Q3}$ through the transistor Q3 is increased by reducing the resistance of the resistor R2, energy consumption increases, while the output driving power is decreased as the current $I_{Q3}$ is decreased by increasing the resistance of the resistor R2. In fact, as stated in the above literature, energy consumption in the circuit significantly increases as much as 540 mW under 12 Volts if its output driving power is to be maintained at a nominal level and output waveforms be maintained not distorted. Such energy consumption is not acceptable from the point of energy saving policy.

In short, when operated for nominal output driving power, prior art amplifier circuits disadvantageously have large energy consumption, much too complicated structures, or poor high frequency characteristics.

SUMMARY OF THE INVENTION

The invention aims to solve these problems pertinent to the prior art amplifier circuits by providing a new type of emitter-grounded amplifier circuit having as desirable non-distorted high-frequency characteristics as the circuit shown in FIG. 1, yet consuming much less energy.

One form of the invention is an amplifier circuit which includes an amplifying stage comprising a first emitter-grounded bipolar transistor and a load circuitry; a second bipolar transistor having a base connected with the output of the amplifying stage to thereby serve as an emitter follower; and an output stage comprising a third bipolar transistor having a base connected with the base of said first bipolar transistor for driving said emitter follower.

With this construction, the amplifier circuit may provide non-distorted amplification in stable operating conditions without consuming much power even when large output is required. The amplifier circuit of the invention is of great advantage especially when it is used in, for example, battery driven portable telephone systems designed to operate with minimum energy consumption in a high frequency band.

DETAILED DESCRIPTION OF THE PREFERRED EMBODIMENT

Figure 4:
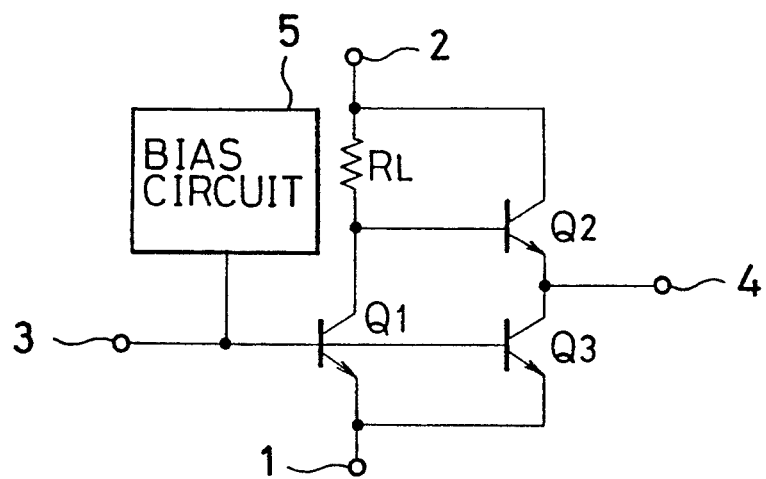
FIG. 4 is a block diagram representation of an amplifier circuit embodying the invention.

A preferred embodiment of the invention will be now described with reference to the accompanying drawings. Referring to FIG. 4, there is shown in block diagram the structure of a first example of the invention, in which a transistor Q1 and a load resistor $R_L$ form an emitter-grounded amplifying stage of the amplifier circuit, while transistors Q2 and Q3 form an emitter follower of tile output stage of the circuit. The bases of the transistors Q1 and Q3 are biased by a common bias circuitry 5. High-frequency signals are input to an input terminal 3.

This example has a type of emitter-grounded amplifying stage, the output of which is received by the emitter follower of the output stage. As described above, the emitter follower includes the transistor Q2, and results in a distortion-free large output driving power at its output terminal 4, in contrast to the one illustrated in FIG. 1. This is the case even when the circuit is operating for a large output.

More particularly, when an input signal is applied to the input terminal 3, the transistors Q1 and Q3 are turned off at the bottom of the signal, while the transistor Q2 is turned on, thereby electric current flows from a power source terminal 2 to the transistor Q2 and is fed to a load (not shown) connected to the output terminal 4 via a capacitor (not shown). As the transistor Q1 and Q3 are turned on at tile peak of the input signal, the transistor Q2 is turned off, thereby allowing electric current to flow from the load via a capacitor (not shown) and the output terminal 4, and then through the transistor Q3 to the grounded terminal 1. Since the input signal is analogue or continuous in magnitude, variation in current accompanying the ON's and OFF's of the transistors is smooth. Because of the alternate switching of the transistors Q2 and Q3 in synchronism with the input signal, only little power is consumed in the output stage, yielding a large output power at the output terminal 4. It will be noted that in contrast to the invention, the amplifier circuit shown in FIG. 1 has a great power loss caused by the heat loss in tile resistor $R_C$ due to current passing through the resistor $R_C$ and to the grounded terminal 1 during the period when the transistor Q2 is turned off. If the power consumption is to be suppressed, the output power is diminished and distortion in waveform of the output signal will result when the transistor Q3 is turned on.

Figure 5:
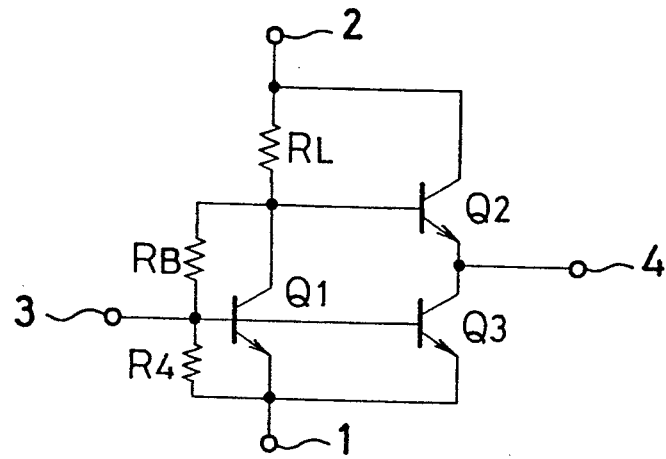
FIG. 5 shows the amplifier circuit of FIG. 4 equipped with a first bias circuit.

FIG. 5 shows an example of the amplifier circuit shown in FIG. 4 equipped with a first specific bias circuitry. In this bias circuitry there is provided a resistor $R_B$ connected between the output of the amplifying stage (i.e. the collector of the transistor Q1) and the bases of the transistors Q1 and the transistor Q3 of the output stage.

Figure 6:
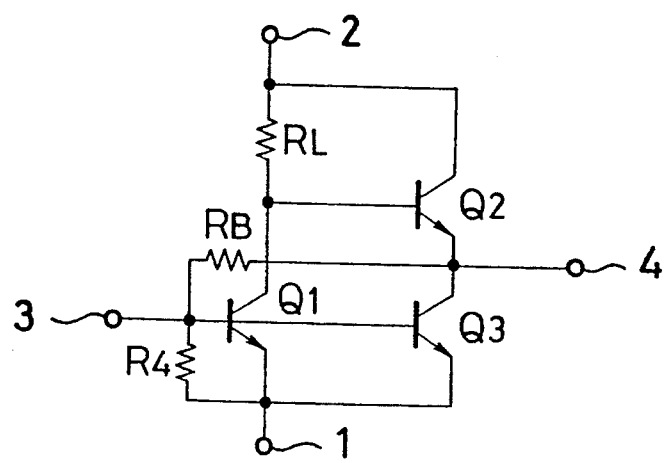
FIG. 6 shows the amplifier circuit of FIG. 4 equipped with a second bias circuit.

Referring to the FIG. 6, there is shown an alternative of the circuit of FIG. 5, in which a resistor $R_B$ is connected between the output of the emitter follower of the output stage(i.e. the emitter of the transistor Q2) and the bases of the transistor Q1 of the amplifying stage and the transistor Q3 of the output stage, for self-biasing the transistors Q1 and Q3. In the examples shown in FIGS. 5 and 6 the feedback resistors $R_B$ may help maintain stable currents through the transistors Q2 and Q3.

Figure 7:
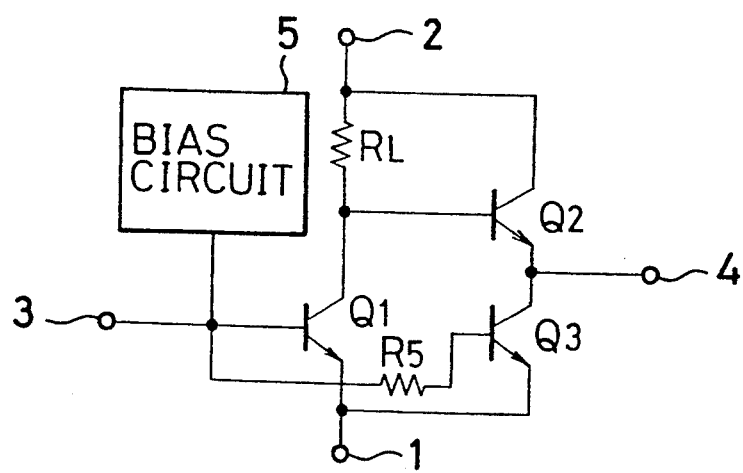
FIG. 7 is a block diagram representation of an alternative amplifier circuit of the invention.

It will be understood that a resistor R4 is provided between the input terminal 3 and the grounded terminal 1 for suppressing the influence of manufacturing fluctuations in current amplification rate $h_{fe}$ of the transistors Q2 and Q3. It will be also understood that the input signal applied to the terminal 3 may be bifurcated to the base of the transistor Q3 via a resistor R5 as shown in FIG. 7.

Figure 1:
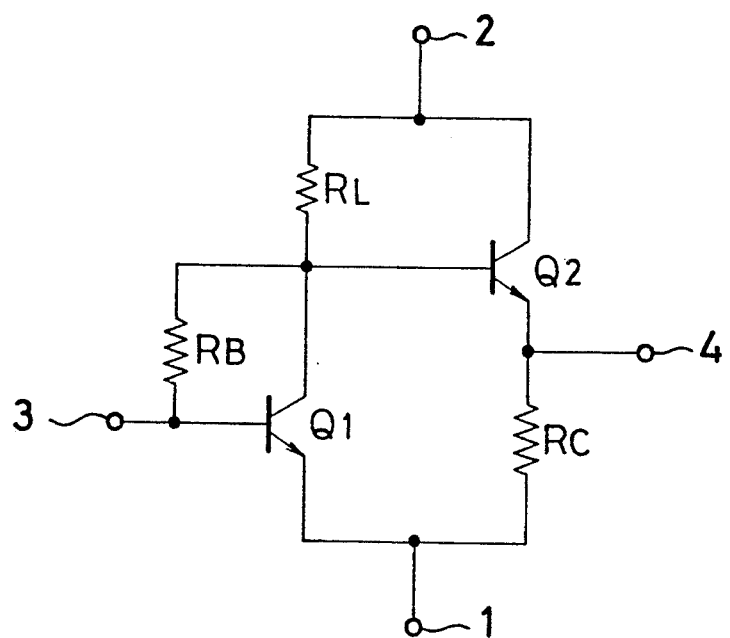
FIG. 1 illustrates a typical emitter-grounded high-frequency amplifier circuit.
Figure 2:
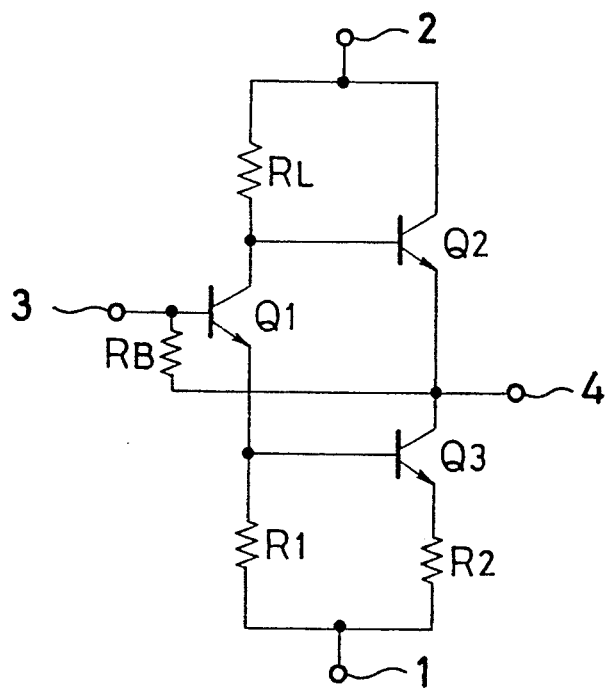
FIG. 2 shows a first example of prior art amplifier circuits.
Figure 3:
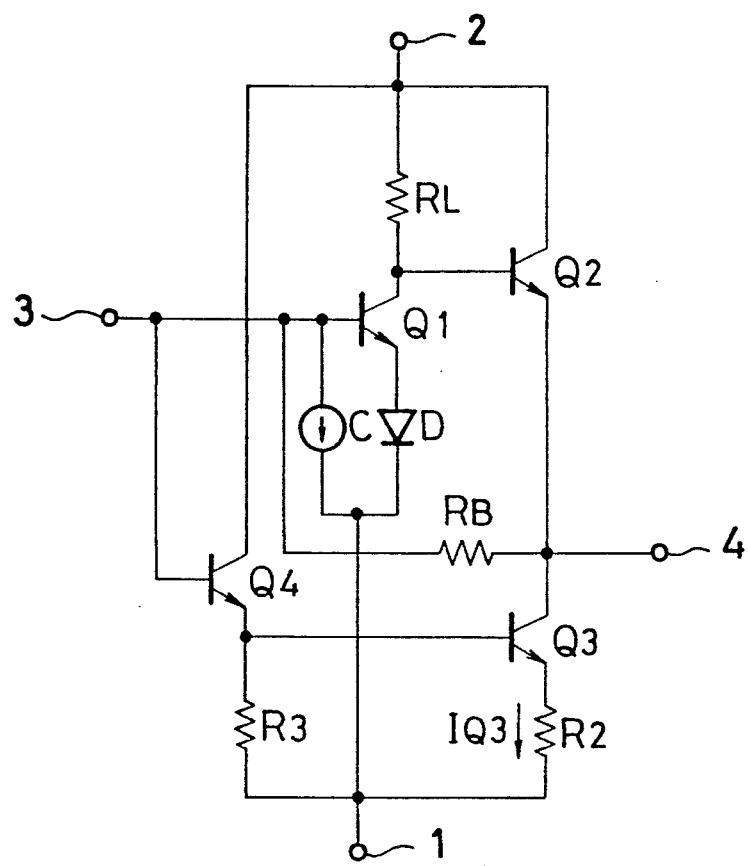
FIG. 3 shows a second example of prior art amplifier circuits.
Figure 8:
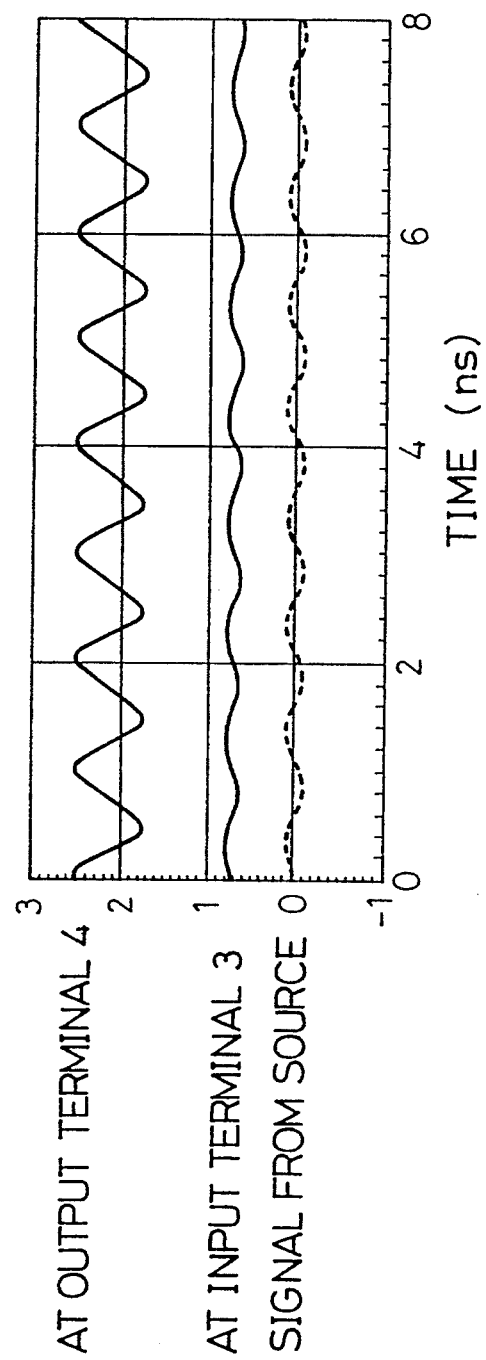
FIG. 8 shows the waveforms obtained in simulations of the amplifier circuit shown in FIG. 5.
Figure 9:
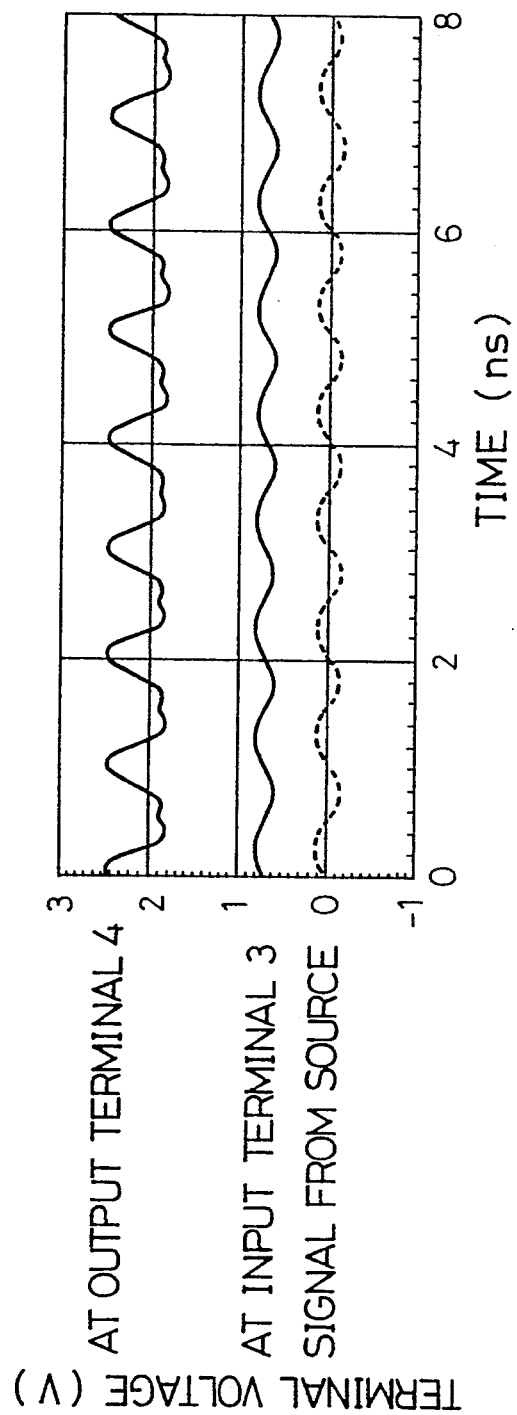
FIG. 9 shows the waveforms obtained in simulations of the amplifier circuit shown in FIG. 1.

FIGS. 8 and 9 show, respectively, the results of simulations of the present invention (FIG. 5) and prior art amplifier circuit shown in FIG. 1. In the simulations the voltage of the power source was 5 Volts; the electric current in the amplifying stage, 2 mA; and the electric current in the output stage, 4 mA. Signals were input to the input terminal 3 via a 50 ohm impedance, and the output from the terminal 4 was cut by, a capacitor and then terminated by 50 ohm impedances. Sinusoidal waves having amplitude of 0.2 Volts were used as signals. Comparison of the FIGS. 8 and 9 reveals that the output waveform obtained by the amplifier circuit of the invention has less distortion than the waveform obtained by the circuit of FIG. 1, verifying an improvement in output driving power of the invention.

I claim:

1. An amplifier circuit, comprising:
   an amplifying stage including a first emitter-grounded bipolar transistor and a load circuitry; and
   an output stage including
   a second bipolar transistor serving as an emitter-follower having its base connected with the output of said amplifying stage; and
   a third bipolar transistor having its base connected with the base of said first bipolar transistor, for driving said emitter-follower, output of said amplifier circuit being taken between the emitter of said second bipolar transistor and the collector of said third bipolar transistor.

2. An amplifier circuit, comprising:
   an emitter-grounded amplifying stage including a first emitter-grounded bipolar transistor;
   a load circuitry connected between the collector of said first bipolar transistor and a power source terminal; and
   a bias circuitry for supplying power to the base of said first bipolar transistor,
   the base and collector of said first bipolar transistor serving as an input and output ends, respectively, of said emitter-grounded amplifying stage, and
   an emitter follower including
   a second bipolar transistor having its collector connected with said power source terminal and its base connected with the output of said emitter-grounded amplifying stage;
   a third bipolar transistor having its collector connected with the emitter of said second bipolar transistor and its emitter grounded,
   a junction connecting the emitter of said second bipolar transistor and the collector of said third bipolar transistor, serving as a output terminal of said amplifier circuit,
   the base of said third bipolar transistor connected with the base of said first bipolar transistor.

3. The amplifier circuit as claimed in claim 2, wherein said bias circuitry comprises a resistance feedback circuitry connected between the base and the collector of said first bipolar transistor.

4. The amplifier circuit as claimed in claim 2, wherein said bias circuitry comprises a resistance feedback circuit connected between the base of said first bipolar transistor and the emitter of said second bipolar transistor.

5. The amplifier circuit as claimed in claim 2, wherein the base of said third bipolar transistor is connected with the base of said first bipolar transistor via a resistor.

* * * * *